United States Patent
Oswald

(10) Patent No.: US 9,660,602 B2
(45) Date of Patent: May 23, 2017

(54) DEVICE AND METHOD FOR FILTERING ELECTROMAGNETIC INTERFERENCE

(71) Applicant: Valeo Systemes de Controle Moteur, Cergy Saint Christophe (FR)

(72) Inventor: Dominique Oswald, Houilles (FR)

(73) Assignee: Valeo Systemes de Controle Moteur, Cergy Saint Christophe (FR)

( * ) Notice: Subject to any disclaimer, the term of this patent is extended or adjusted under 35 U.S.C. 154(b) by 0 days.

(21) Appl. No.: 14/767,156

(22) PCT Filed: Feb. 12, 2014

(86) PCT No.: PCT/FR2014/050273
§ 371 (c)(1),
(2) Date: Aug. 11, 2015

(87) PCT Pub. No.: WO2014/125212
PCT Pub. Date: Aug. 21, 2014

(65) Prior Publication Data
US 2015/0381136 A1  Dec. 31, 2015

(30) Foreign Application Priority Data
Feb. 13, 2013 (FR) ..................... 13 51202

(51) Int. Cl.
*H03H 7/09* (2006.01)
*H03H 7/06* (2006.01)
(Continued)

(52) U.S. Cl.
CPC ........... *H03H 1/0007* (2013.01); *H01F 27/24* (2013.01); *H01F 27/2823* (2013.01);
(Continued)

(58) Field of Classification Search
CPC .. H03H 1/0007; H03H 7/0115; H03H 7/0138; H03H 7/06; H03H 7/09; H03H 7/427
(Continued)

(56) References Cited

U.S. PATENT DOCUMENTS 6,008,561 A * 12/1999 Tang ..................... H02K 19/103
310/180
6,075,425 A * 6/2000 Gopfrich ................. H02M 1/12
307/105
(Continued)

FOREIGN PATENT DOCUMENTS

DE      295 06 951 U1    6/1995
DE  20 2009 013362 U1   12/2009
(Continued)

OTHER PUBLICATIONS

International Search Report issued in PCT/FR2014/050273 mailed on May 20, 2014 (3 pages).

Primary Examiner — Stephen E Jones
Assistant Examiner — Rakesh Patel
(74) Attorney, Agent, or Firm — Osha Liang LLP

(57) ABSTRACT

Device (1) for filtering electromagnetic interference, comprising: —a plurality of electrical conductors (5) mounted in parallel, each conductor (5) comprising a first coil (10) disposed between a first (7) and a second (8) end of the conductor (5), said first coils (10) being coupled magnetically together and exhibiting one and the same first number of turns, said first (7) and second (8) ends of the conductors (5) respectively defining first (7) and second (8) terminals for the device, —a plurality of capacitors (13), each capacitor (13) being mounted between the second and (8) of an electrical conductor (5) and a third terminal (15) of the device, and —an additional circuit (20) comprising a second coil (21) coupled magnetically with the first coils (10) and (Continued)

exhibiting a second number of turns, said circuit (20) furthermore comprising an additional coil (23).

9 Claims, 2 Drawing Sheets

(51) Int. Cl.
| | | |
|---|---|---|
| | *H03H 1/00* | (2006.01) |
| | *H03H 7/01* | (2006.01) |
| | *H02M 1/12* | (2006.01) |
| | *H03H 7/42* | (2006.01) |
| | *H01F 27/24* | (2006.01) |
| | *H01F 27/28* | (2006.01) |

(52) U.S. Cl.
CPC .......... *H02M 1/126* (2013.01); *H03H 7/0115* (2013.01); *H03H 7/06* (2013.01); *H03H 7/09* (2013.01); *H03H 7/427* (2013.01); *H02M 2001/123* (2013.01)

(58) Field of Classification Search
USPC ........................ 333/181, 12, 172; 318/400.24
See application file for complete search history.

(56) References Cited

U.S. PATENT DOCUMENTS

2005/0040093 A1* 2/2005 Yanagisawa .......... H01F 17/043
　　　　　　　　　　　　　　　　　　　　　　　　　210/223
2007/0296374 A1 12/2007 Baudesson et al.

FOREIGN PATENT DOCUMENTS

| DE | 10 2008 062133 A1 | 6/2010 |
|---|---|---|
| JP | 2001 197665 A | 7/2001 |
| WO | 03/105328 A1 | 12/2003 |
| WO | 2010/057893 A1 | 5/2010 |

* cited by examiner

DEVICE AND METHOD FOR FILTERING ELECTROMAGNETIC INTERFERENCE

FIELD OF THE INVENTION

The present invention relates to the filtering of electromagnetic interference, also known by the acronym EMI. Such electromagnetic interference occurs, for example, at frequencies above 1 kHz, such frequencies corresponding, for example, to the switching frequency of solid state converters. Such EMI interference is linked to the common mode current and to the differential mode current.

The invention applies, for example, for filtering electromagnetic interference occurring in the exchange of electrical energy between an electrical network and an electrical energy storage unit, the latter notably being installed on an electric or hybrid vehicle. The electrical energy storage unit is, for example, used to power an electric motor used to propel the vehicle.

BACKGROUND

It is known practice to reduce such electromagnetic interference using passive filters. A number of examples of such passive filters are represented in FIGS. 1 to 3, these filters being placed in the electrical line used to transfer electrical energy between the network and the electrical energy storage unit.

FIG. 1 represents an electromagnetic interference filtering device 100 implementing a conventional LC filter for each electrical conductor of the line linking the electrical network 101, represented here in the form of a voltage source, to the electrical energy storage unit 102, represented here in the form of a current source. The device 100 comprises a coil 103 and a capacitor 104. This LC filter has the drawback of exhibiting a significant resonance at its cutoff frequency.

To correct this phenomenon, other electromagnetic interference filtering devices are known.

FIG. 2 represents such a device 110 in which an additional branch 111 is mounted in parallel to the capacitor 104. The damping of the resonance of the conventional LC filter depends on the choice of the ratio between the capacitance value of the capacitor of the additional branch and the capacitance value of the capacitor 104.

FIG. 3 represents another device 120 in which an additional branch 121 is provided for each electrical conductor of the line, this additional branch 121 being mounted in parallel to the coil 103 of said conductor. Each additional branch 121 comprises, in this example, an additional coil 123 and a resistor 124. The additional coils 123 are coupled magnetically together and with the coils 103. The filter 120 is used to damp the resonance at the cutoff frequency of the LC filter according to the device 100 without this cutoff frequency being shifted.

The devices 110 and 120 require the addition of a certain number of additional components to damp the resonance observed at the cutoff frequency of the LC filter of the device 100, which is costly and can create other drawbacks. For example, in the case of the filter 120, each additional branch 121 mounted in parallel to a coil 103 can generate a stray capacitance, affecting the resonant behavior of the coil 103 and thus degrading the behavior of the device 120.

SUMMARY

There is a need to benefit from an electromagnetic interference filtering device which simply and inexpensively remedies all or some of the abovementioned drawbacks.

The aim of the invention is to address this need and it achieves this, according to one of its aspects, using a device for filtering electromagnetic interference, comprising:
- a plurality of electrical conductors mounted in parallel, each conductor comprising a first coil positioned between a first and a second end of the conductor, said first coils being coupled magnetically together and having a same first number of turns, said first and second ends of the conductors respectively defining first and second terminals for the device,
- a plurality of capacitors, each capacitor being mounted between the second end of an electrical conductor and a third terminal of the device, and
- an additional circuit comprising a second coil coupled magnetically with the first coils and having a second number of turns, said circuit further comprising an additional coil. According to the invention, the additional circuit makes it possible to remedy the problem of resonance of the LC filter of FIG. 1 without exhibiting the drawbacks of the devices of FIGS. 2 and 3.

The device according to the invention can make it possible to passively filter the common mode interference.

The additional circuit need not have any operational amplifier, transistor or any other controllable electronic component.

The additional circuit may be formed solely using passive components such as resistor(s), coil(s) and/or capacitor(s).

The additional circuit implements a damping of "LR" type, the resistance concerned being able to be the internal resistance of the additional coil and/or the internal resistance of the second coil, in which case the additional circuit has no dedicated resistance-forming component.

As a variant, the additional circuit can comprise a resistor, for example a resistor mounted in series with the second coil and with the additional coil.

This damping of "LR" type provides the advantages that are already known of the filter 120.

Furthermore, when the additional circuit is not linked electrically to the rest of the device but only by the magnetic coupling between the first and the second coils, the reduction of this coupling at high frequencies makes it possible for the additional circuit to be, for these frequencies, relatively transparent to the rest of the device, or even for the additional circuit to be able to be considered as disconnected from the rest of the device for these frequencies. The possibility of the additional circuit, possibly interacting with other elements of the device, being able to generate resonances at high frequencies is thus avoided. Furthermore, the additional circuit can implement only a single second coil magnetically coupled with the first coils, and not a plurality of second coils 123 as in the filter 120 of FIG. 3. Furthermore, the additional circuit may no longer need any added capacitor, unlike the filter 110 of FIG. 2.

The number of conductors can be greater than or equal to two. This number is, for example, equal to two in the case where the electrical energy is transferred in the form of a single-phase signal, one of the conductors then forming the phase of the signal and the other conductor then forming the neutral of this signal.

As a variant, more than two conductors can be used, for example three in the case where the transfer of electrical energy is done in the form of a three-phase signal.

The second number of turns can be different from the first number of turns. The ratio between the first number of turns and the second number of turns can be greater than one, being notably greater than three. In one particular example, the first number of turns can be equal to fourteen while the second number of turns is equal to four. Such a ratio value makes it possible to reduce the value of the inductance of the additional coil. It is thus possible to use an additional coil of lower inductance, thus limiting the cost and the bulk incurred by this additional coil.

The value chosen for the ratio between the first and the second numbers of turns can also make it possible to reduce the stray capacitance associated with the additional circuit. This low stray capacitance value will then be negligible compared to that already present on the first coils which are magnetically coupled together. Furthermore, the additional circuit can thus not affect the differential mode behavior of the first coils magnetically coupled together.

The first coils and the second coil can be wound around a same magnetic core, thus producing the abovementioned magnetic coupling. It is, for example, a nanocrystalline or ferrite core.

In this case, the core can be configured so as to exhibit a mutual inductance value of between 1 mH and 10 mH at a frequency of 10 kHz, for example of the order of 8.5 mH at 10 kHz. The additional coil can then exhibit an inductance of 100 µH at this same frequency.

According to the above, the additional circuit can be not connected electrically to the rest of the device, being linked to the rest of the device only via the magnetic coupling between the second coil and the first coils.

The third terminal of the device can be singular.

Another subject of the invention, according to another of its aspects, is a method for filtering electromagnetic interference when electrical energy is transferred from an electrical network to an electrical energy storage unit and vice versa, a method in which said filtering is performed by interposing, between the electrical network and the electrical energy storage unit, a device as defined above.

When this method is implemented, the first terminals of the device can be linked to the electrical network, the second terminals of the device can be linked directly or not to the electrical energy storage unit and the third terminal of the device can be linked to the earth.

The electrical network can supply a direct voltage or an alternating voltage, for example a single-phase or three-phase voltage.

The alternating voltage supplied by this network can have a frequency of the order of 50 Hz or 60 Hz. It can be a single-phase network supplying a voltage of between 120 V and 240 V or a polyphase network, for example three-phase, notably a three-phase network supplying a voltage of between 208 V and 416 V.

The electrical energy storage unit exhibits, for example, a nominal voltage of between 60 V and 600 V, notably between 200 V and 400 V. This electrical energy storage unit can comprise one or more batteries or any other type of electrical energy storage units, for example supercapacitors. It comprises, for example, batteries in series, in parallel/or branches in parallel of batteries in series.

This electrical energy storage unit can be installed on an electric or hybrid vehicle and be intended to electrically power an electric motor used to propel the vehicle. The electric motor for example has a nominal power of between 3 kW and 200 kW.

The device according to the invention may or may not be installed on the vehicle.

The device can then be incorporated in a circuit used to charge the electrical energy storage unit from the electrical network. As a variant, the device according to the invention can be incorporated in a circuit used to both: charge the electrical energy storage unit from the electrical network through the winding of the stator of the motor, and electrically power this winding of the stator from the electrical energy storage unit. Such a circuit is, for example, known from the application WO 2010/057893 in the name of the Applicant.

BRIEF DESCRIPTION OF DRAWINGS

The invention will be able to be better understood on reading the following description of a nonlimiting exemplary implementation thereof and on studying the attached drawing in which.

DETAILED DESCRIPTION

Figure 4:
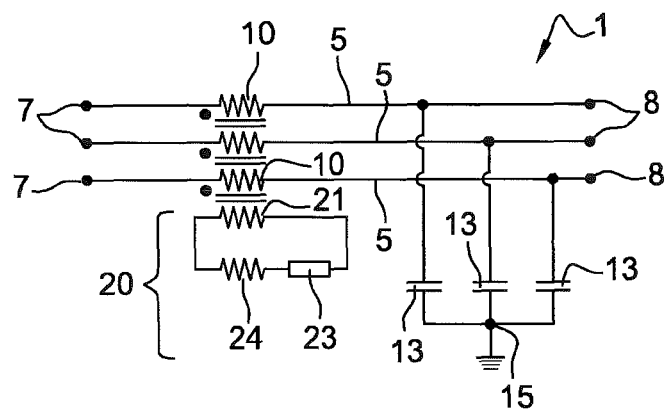

FIG. 4 represents an electromagnetic interference filtering device 1 according to an exemplary implementation of the invention. This device 1 is, in this example, incorporated in a three-phase power supply line interposed between a three-phase electrical network that is not represented and an electrical energy storage unit that is not represented. This electrical energy storage unit is, for example, a battery powering an electric vehicle motor used to propel the vehicle.

The line comprises, at the level of the device 1, three electrical conductors 5 which each extend between a first end 7 and a second end 8, said ends 7 and 8 forming first terminals 7 and second terminals 8 for the device 1.

Between the ends 7 and 8, each electrical conductor 5 comprises a first coil 10. The first coils 10 each comprise a same first number of turns and they are wound around a common magnetic core, being coupled magnetically together. These first coils 10 thus form a common mode inductance.

The device 1 further comprises a capacitor 13 positioned between each second end 8 of a conductor and a third common terminal 15 of the device 1. As represented in FIG. 4, this third terminal 15 is, here, linked to the earth.

For each phase of the electrical signal conveyed by the line, a first coil 10 and a capacitor 13 form an LC filter similar to the filter 100 described with reference to FIG. 1.

As can be seen in FIG. 4, the device 1 further comprises an additional circuit 20 which, in this example, comprises a second coil 21 wound around the magnetic core around which the first coils 10 are also wound.

The second coil 21 has a second number of turns which is, here, less than the first number of turns. The first number of turns and the second number of turns can be chosen relative to one another such that the ratio between this first and this second number of turns is greater than three.

As represented in FIG. 4, the additional circuit 20 can comprise an additional coil 23 in series with a resistor 24 and the second coil 21.

The additional coil 23 and the resistor 24 thus make it possible to produce a damping of LR type of the resonance at the cutoff frequency of the LC filter formed by each "first coil 10-capacitor 13" pair.

As can be seen, the additional circuit 20 need not have any electrical connection with the rest of the device 1, being linked thereto only by the magnetic coupling provided by the common magnetic core.

In one example, the common magnetic core is configured in such a way that the mutual impedance value between the different coils 10 or 23 wound around this core is 8.5 mH at 10 kHz. Still in this example, each capacitor 13 has a capacitance of 22 nF, the first number of turns is equal to fourteen, and the second number of turns is equal to four. The additional coil 23 can then exhibit an impedance at 10 kHz of 15.6 mH and the resistor 24 can have a value of 18Ω.

Figure 5:
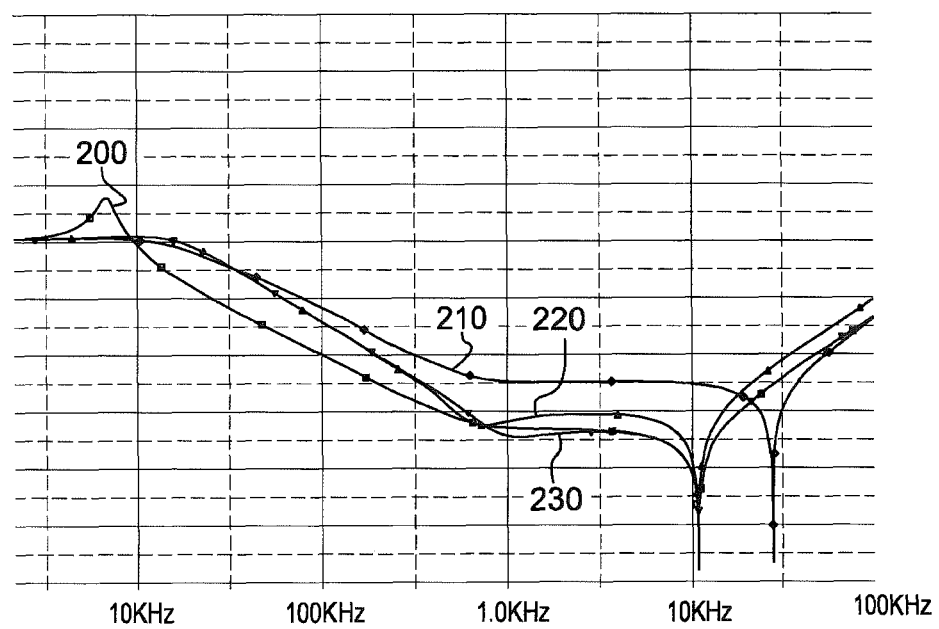
FIG. 5 is a Bode diagram showing the gain response of the filtering devices represented in FIGS. 1 to 4.

FIG. 5 is a Bode diagram representing the gain of the filtering devices described with reference to FIGS. 1 to 4.

Figure 1:
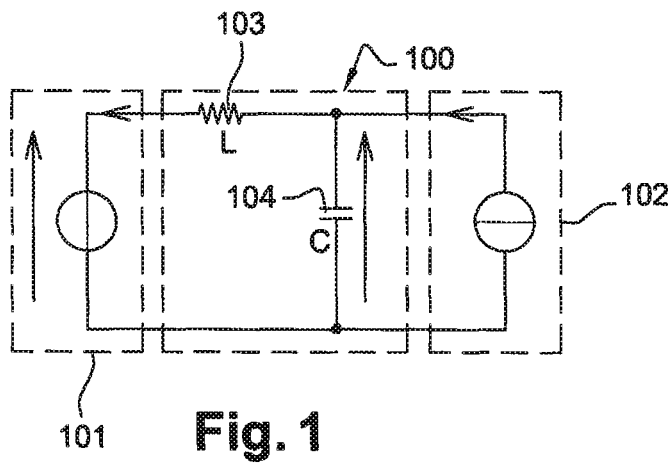
FIGS. 1 to 3 schematically represent examples of electromagnetic interference filtering devices already known from the prior art and already described, FIG. 4 schematically represents an exemplary electromagnetic interference filtering device according to the invention.
Figure 2:
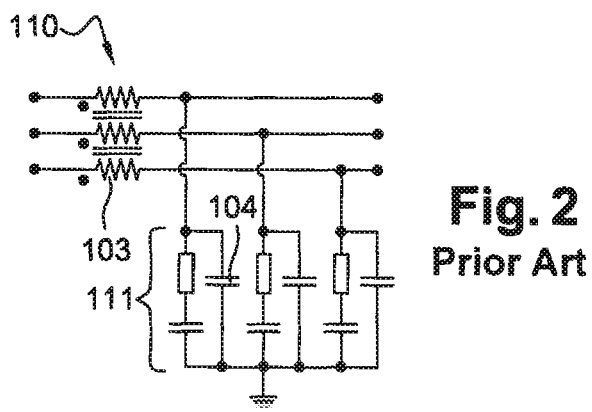
Figure 3:
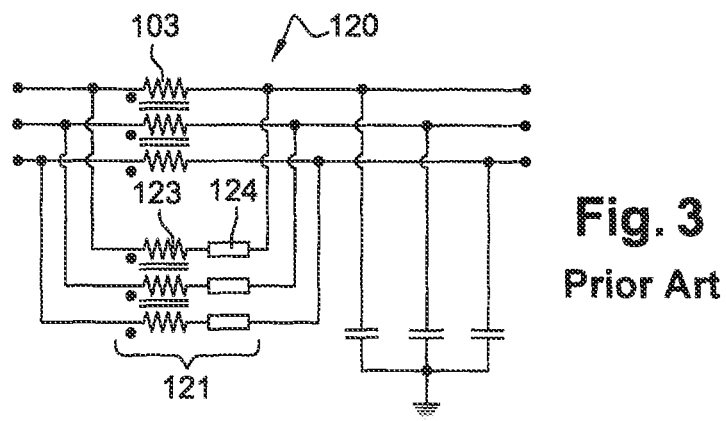

The curve 200 corresponds to the device 100 of FIG. 1, the curve 210 corresponds to the device 110 of FIG. 2, the curve 220 corresponds to the device 120 of FIG. 3 and the curve 230 corresponds to the device 1 of FIG. 4.

As can be seen, the device 1 makes it possible to significantly damp the resonance occurring at the cutoff frequency of the device 100.

It can be observed that the frequency response in terms of gain of the device 1 according to the invention remains very close to that of the device 120 of FIG. 3 up to the mean frequency values.

On the one hand, it can be observed that the resonance at the cutoff frequency of the LC filter formed by each first coil 10 and a capacitor 13 is damped. Beyond this cutoff frequency, it is observed that the device according to the invention makes it possible to obtain the response closest to that of the LC filter formed by each first coil 10 and a capacitor 13.

The cutoff frequency of said LC filter is, for example, between 10 kHz and 100 kHz, being for example of the order of 8 kHz.

The invention is not limited to the example which has just been described.

In particular, in another example, the additional circuit 20 need not have a resistor 24, the damping of LR type provided by the additional circuit 20 then being obtained by virtue of the additional coil 23 and by the second coil 21 which then act both as inductor and as resistor via their internal resistance.

The expression "comprising a" should be understood to be synonymous with the expression "comprising at least one", unless otherwise specified.

The invention claimed is:

1. A device for filtering electromagnetic interference, comprising:
    a plurality of electrical conductors mounted in parallel, each conductor comprising a first coil positioned between a first and a second end of the respective conductor, said first coils being coupled magnetically together and having a same first number of turns, said first and second ends of each of the conductors respectively defining first and second terminals for the device;
    a plurality of capacitors, each capacitor being mounted between the second end of a corresponding electrical conductor and a third terminal of the device; and
    an additional circuit comprising a second coil coupled magnetically with the first coils and having a second number of turns, said circuit further comprising an additional coil,
    wherein the second number of turns is different from the first number of turns.

2. The device as claimed in claim 1, the number of electrical conductors being equal to three.

3. The device as claimed in claim 1, the ratio between the first number of turns and the second number of turns being greater than three.

4. The device as claimed in claim 1, the additional circuit comprising a resistor.

5. The device as claimed in claim 4, the second coil, the additional coil and the resistor being mounted in series.

6. The device as claimed in claim 1, the first coils and the second coil being wound around a same magnetic core.

7. The device as claimed in claim 6, the core being configured so as to exhibit a mutual inductance value of between 1 mH and 10 mH at a frequency of 10 kHz.

8. A method for filtering electromagnetic interference when electrical energy is transformed from an electrical network to an electrical energy storage unit and vice versa, the method comprising:
    performing filtering by interposing, between the electrical network and the energy storage unit, a device as claimed in claim 1.

9. The method a claimed in claim 8, in which the first terminals of the device are linked to the electrical network, the second terminals of the device are linked to the energy storage unit and the third terminal of the device is linked to the earth.

* * * * *